US012647079B2

(12) United States Patent　　(10) Patent No.: US 12,647,079 B2

Tahara et al.　　(45) Date of Patent:　Jun. 2, 2026

(54) POWER AMPLIFIER CIRCUIT AND COMMUNICATION DEVICE

(71) Applicant: Murata Manufacturing Co., Ltd., Nagaokakyo (JP)

(72) Inventors: Kenji Tahara, Nagaokakyo (JP); Kensuke Takimoto, Nagaokakyo (JP); Kae Yamamoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 345 days.

(21) Appl. No.: 18/420,805

(22) Filed: Jan. 24, 2024

(65) Prior Publication Data

US 2024/0171140 A1　May 23, 2024

Related U.S. Application Data

(63) Continuation of application No. PCT/JP2022/024895, filed on Jun. 22, 2022.

(30) Foreign Application Priority Data

Jul. 29, 2021　(JP) ................................. 2021-124361

(51) Int. Cl.
　　*H03F 3/24*　　　(2006.01)
　　*H03F 1/02*　　　(2006.01)
　　*H04B 1/04*　　　(2006.01)

(52) U.S. Cl.
　　CPC ........... *H03F 3/245* (2013.01); *H03F 1/0216* (2013.01); *H04B 1/0475* (2013.01);
　　(Continued)

(58) Field of Classification Search
　　CPC ... H03F 3/24; H03F 3/245; H03F 1/02; H03F 1/0216; H03F 2200/294; H03F 2200/415;
　　(Continued)

(56) References Cited

U.S. PATENT DOCUMENTS 8,035,444 B2 * 10/2011 Okubo .................. H03F 1/0288
　　　　　　　　　　　　　　　　330/124 R
10,164,589 B2 * 12/2018 Takenaka .............. H03F 3/4508
　　　　　　　(Continued)

FOREIGN PATENT DOCUMENTS

JP　　2010-050986 A　　3/2010
JP　　2010-118824 A　　5/2010
　　　　　(Continued)

OTHER PUBLICATIONS

International Search Report and Written Opinion mailed on Sep. 27, 2022, received for PCT Application PCT/JP2022/024895, filed on Jun. 22, 2022, 8 pages including English Translation.

*Primary Examiner* — Hai V Nguyen

(74) *Attorney, Agent, or Firm* — XSENSUS LLP

(57)　　　　　ABSTRACT

A power amplifier circuit that includes a carrier amplifier, peaking amplifiers, an input coil, an output coil, an input coil, an output coil, an output terminal to which one end of the output coil is connected, and ¼-wavelength transmission lines. The carrier amplifier is connected to one end of the input coil. The peaking amplifier is connected to one end of the ¼-wavelength transmission line. The peaking amplifier is connected to one end of the input coil. The peaking amplifier is connected to one end of the ¼-wavelength transmission line. The other end of the ¼-wavelength transmission line is connected to the other end of the input coil. The other end of the ¼-wavelength transmission line is connected to the other end of the input coil. One end of the output coil is connected to the other end of the output coil.

20 Claims, 8 Drawing Sheets

(52) U.S. Cl.
CPC .. *H03F 2200/294* (2013.01); *H03F 2200/451* (2013.01); *H03F 2200/541* (2013.01); *H04B 2001/0416* (2013.01)

(58) Field of Classification Search
CPC ............... H03F 2200/541; G04B 1/04; G04B 2001/0416
See application file for complete search history.

(56) References Cited

U.S. PATENT DOCUMENTS

| | | | | |
|---|---|---|---|---|
| 11,824,501 | B2 * | 11/2023 | Imai .................... | H03F 3/45475 |
| 12,074,995 | B2 * | 8/2024 | Tomita .................... | H03F 3/189 |
| 2010/0117726 | A1 * | 5/2010 | Okubo .................. | H03F 1/0288 330/124 R |
| 2012/0025915 | A1 * | 2/2012 | Ui ........................... | H03F 3/189 330/124 R |
| 2017/0163220 | A1 * | 6/2017 | Yamamoto ................ | H03F 1/56 |
| 2018/0241362 | A1 * | 8/2018 | Takenaka .............. | H03F 1/0288 |
| 2023/0318546 | A1 * | 10/2023 | Tanaka .................. | H03F 1/0288 330/252 |

FOREIGN PATENT DOCUMENTS

| | | |
|---|---|---|
| JP | 2014-165724 A | 9/2014 |
| JP | 2018-137566 A | 8/2018 |

* cited by examiner

FIG. 1

| | POWER AMPLIFIER CIRCUIT 1 (EMBODIMENT) |
| | CARRIER AMPLIFIER 11 / PEAKING AMPLIFIERS 12 TO 14: ON |
| | CARRIER AMPLIFIER 11 / PEAKING AMPLIFIERS 12 AND 13: ON |
| | CARRIER AMPLIFIER 11 / PEAKING AMPLIFIER 12: ON |
| | CARRIER AMPLIFIER 11: ON |

VOLTAGE

Analog ET

RF time

POWER AMPLIFIER CIRCUIT AND COMMUNICATION DEVICE

CROSS-REFERENCE TO RELATED APPLICATIONS

This is a continuation application of PCT/JP2022/024895, filed on Jun. 22, 2022, designating the United States of America, which is based on and claims priority to Japanese Patent Application No. JP 2021-124361 filed on Jul. 29, 2021. The entire contents of the above-identified applications, including the specifications, drawings and claims, are incorporated herein by reference in their entirety.

TECHNICAL FIELD

The present disclosure relates to a power amplifier circuit and a communication device.

BACKGROUND ART

Patent Document 1 discloses a power amplifier circuit including first and second amplifiers and first and second transformers. The first amplifier (carrier amplifier) amplifies a first signal obtained by distributing an input signal and outputs a second signal, in a region where the power level of the input signal is higher than or equal to a first level. The second signal is input into the first transformer. The second amplifier (peaking amplifier) amplifies a third signal obtained by distributing an input signal and outputs a fourth signal, in a region where the power level of the input signal is higher than or equal to a second level. The second level is higher than the first level. The fourth signal is input into the second transformer.

CITATION LIST

Patent Document

Patent Document 1: Japanese Unexamined Patent Application Publication No. 2018-137566

SUMMARY OF DISCLOSURE

Technical Problem

Assuming digital ET is applied to a power supply voltage of the power amplifier circuit disclosed in Patent Document 1, however, it may not be possible to secure a large amount of back-off. Back-off is a difference between power in a high output region where the carrier amplifier and the peaking amplifier are both ON and power in a low output region where only the carrier amplifier is ON.

The present disclosure provides a small-sized power amplifier circuit and a communication device that can secure a large amount of back-off.

Solution to Problem

A power amplifier circuit according to an aspect of the disclosure includes first, second, third, and fourth amplifying elements, a first transformer including a first input coil and a first output coil, a second transformer including a second input coil and a second output coil, a signal output terminal to which one end of the first output coil is connected, and first and second phase shifter circuits. An output terminal of the first amplifying element is connected to one end of the first input coil. An output terminal of the second amplifying element is connected to one end of the first phase shifter circuit. An output terminal of the third amplifying element is connected to one end of the second input coil. An output terminal of the fourth amplifying element is connected to one end of the second phase shifter circuit. The other end of the first phase shifter circuit is connected to the other end of the first input coil. The other end of the second phase shifter circuit is connected to the other end of the second input coil. One end of the second output coil is connected to the other end of the first output coil, and the other end of the second output coil is connected to a ground.

A power amplifier circuit according to an aspect of the disclosure includes first, second, and third amplifying elements, a first transformer including a first input coil and a first output coil, a second transformer including a second input coil and a second output coil, a signal output terminal to which one end of the first output coil is connected, and a phase shifter circuit. An output terminal of the first amplifying element is connected to one end of the first input coil. An output terminal of the second amplifying element is connected to one end of the second input coil. An output terminal of the third amplifying element is connected to one end of the phase shifter circuit. The other end of the phase shifter circuit is connected to the other end of the second input coil. The other end of the first input coil is connected to a ground. One end of the second output coil is connected to the other end of the first output coil, and the other end of the second output coil is connected to a ground.

A power amplifier circuit according to an aspect of the disclosure includes first, second, and third amplifying elements, a first transformer including a first input coil and a first output coil, a second transformer including a second input coil and a second output coil, a signal output terminal to which one end of the first output coil is connected, and a phase shifter circuit. An output terminal of the first amplifying element is connected to one end of the first input coil. An output terminal of the second amplifying element is connected to one end of the phase shifter circuit. An output terminal of the third amplifying element is connected to one end of the second input coil. The other end of the phase shifter circuit is connected to the other end of the first input coil. The other end of the second input coil is connected to a ground. One end of the second output coil is connected to the other end of the first output coil, and the other end of the second output coil is connected to a ground.

Effects of Disclosure

According to the present disclosure, it is possible to provide a small-sized power amplifier circuit and a communication device that can secure a large amount of back-off.

BRIEF DESCRIPTION OF DRAWINGS

FIG. 1 is a circuit diagram of a power amplifier circuit and a communication device according to an embodiment.

DESCRIPTION OF EMBODIMENTS

Figure 2:
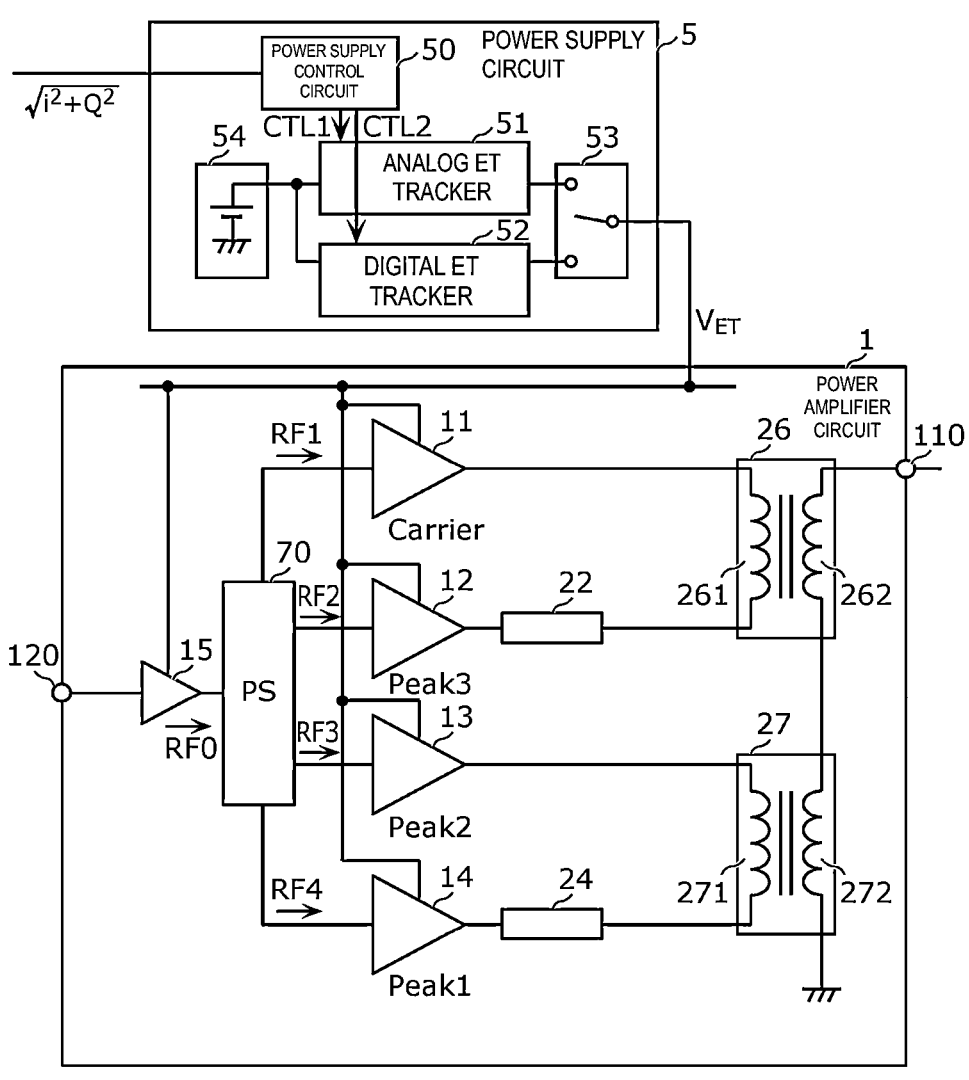
FIG. 2 is a circuit block diagram of the power amplifier circuit and a power supply circuit according to the embodiment.

Embodiments of the disclosure will be described below in detail with reference to the drawings. All the embodiments described below illustrate general or specific examples. Numerical values, configurations, materials, elements, and positions and connection states of the elements, for example, illustrated in the following embodiments are only examples and are not intended to limit the disclosure.

The drawings are only schematically shown and are not necessarily precisely illustrated. For the sake of representation of the disclosure, the drawings are illustrated in an exaggerated manner or with omissions or the ratios of elements in the drawings are adjusted. The shapes, positional relationships, and ratios of elements in the drawings may be different from those of the actual elements. In the drawings, substantially identical elements are designated by like reference numeral and an explanation of such elements may be omitted or be merely simplified from the second time.

In the individual drawings, the x axis and the y axis are axes which are perpendicular to each other on a plane parallel with the main surfaces of a module laminate. More specifically, assuming the module laminate has a rectangular shape in a plan view, the x axis is parallel with a first side of the module laminate, while the y axis is parallel with a second side, which is perpendicular to the first side, of the module laminate. The z axis is an axis perpendicular to the main surfaces of the module laminate. The positive direction of the z axis is the upward direction, while the negative direction of the z axis is the downward direction.

In the circuit configurations of the disclosure, "A is connected to B" includes, not only the meaning that A is directly connected to B using a connection terminal and/or a wiring conductor, but also the meaning that A is electrically connected to B via another circuit element. "An element is connected between A and B" means that the element is connected to both A and B between A and B and includes the meaning that the element is connected in series with a path connecting A and B and also that the element is parallel-connected (shunt-connected) between this path and a ground.

In the layout of components in the disclosure, "in a plan view" means that an object is orthographically projected on an xy plane from the positive side of the z axis and is viewed from this side.

In the present disclosure, "C is disposed at an intersecting portion between a first direction of A and a second direction of B" means that, in a plan view, an intersecting point between a straight line extending from a certain point within A in the first direction and a straight line extending from a certain point within B in the second direction is included in C. Terms representing the relationship between elements, such as "being parallel" and "being vertical", and terms representing the shape of an element, such as "being rectangular", are not necessarily to be interpreted in an exact sense, but to be interpreted in a broad sense. That is, such terms also cover substantially equivalent ranges, such as about several percent of allowance. Additionally, "a first direction and a second direction are the same" includes the meaning, not only that the angle between a direction vector in the first direction and a direction vector in the second direction is exactly 0 degrees, but also that the angle between the two direction vectors is −10 degrees or larger and +10 degrees or smaller.

In the specification, "signal path" means a transmission line constituted by wiring for transferring a radio-frequency signal, an electrode directly connected to the wiring, and a terminal directly connected to the wiring or the electrode, for example.

EMBODIMENTS

[1 Circuit Configurations of Power Amplifier Circuit 1 and Communication Device 7]

Figure 1:
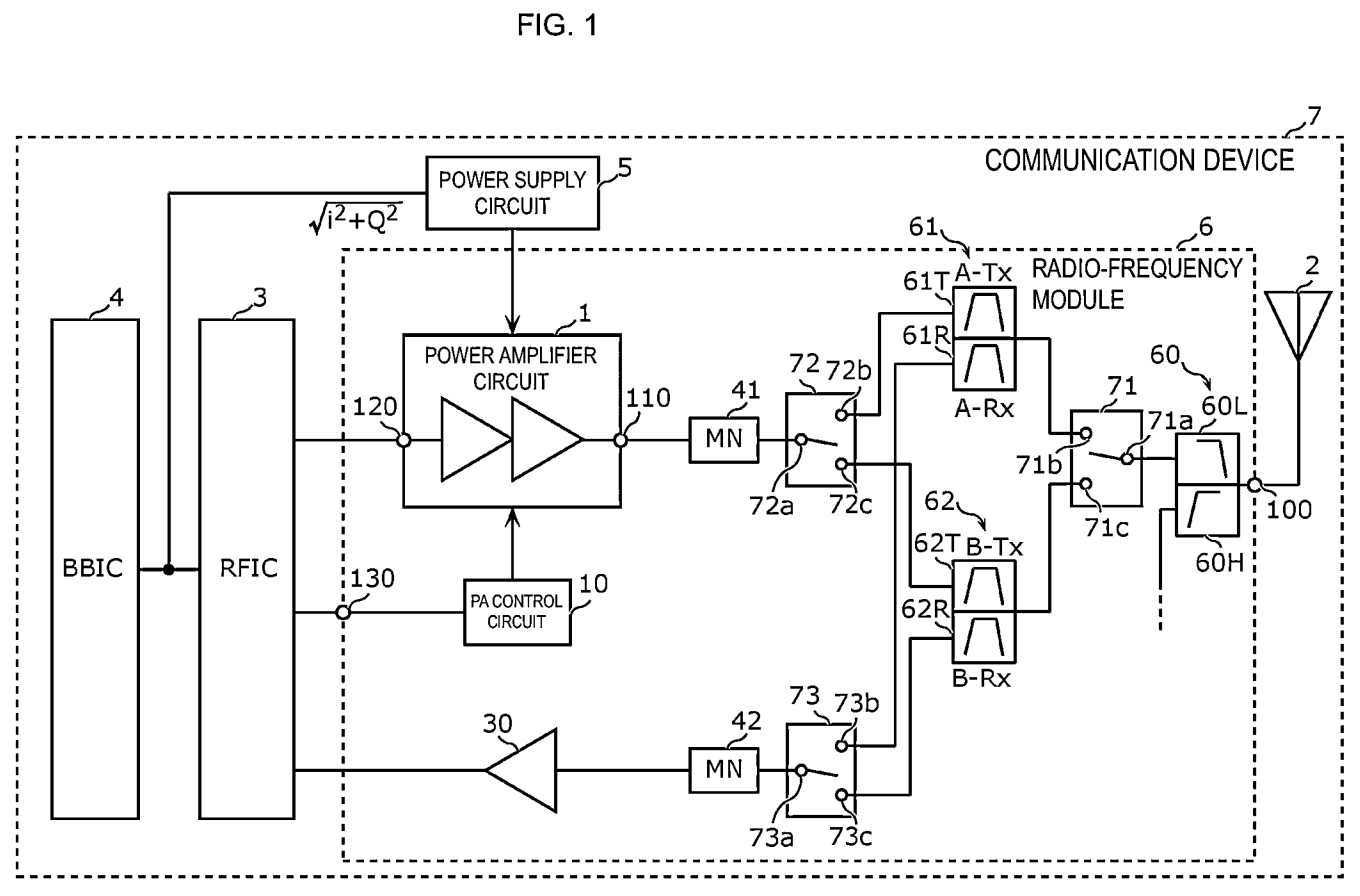

The circuit configurations of a power amplifier circuit 1 and a communication device 7 according to the embodiment will be described below with reference to FIGS. 1 and 2. FIG. 1 is a circuit diagram of the power amplifier circuit 1 and the communication device 7 according to the embodiment. FIG. 2 is a circuit block diagram of the power amplifier circuit 1 and a power supply circuit 5 according to the embodiment.

[1.1 Circuit Configuration of Communication Device 7]

The circuit configuration of the communication device 7 will first be described below. As illustrated in FIG. 1, the communication device 7 according to the embodiment includes a radio-frequency module 6, an antenna 2, an RFIC (Radio Frequency Integrated Circuit) 3, a BBIC (Baseband Integrated Circuit) 4, and a power supply circuit 5.

The radio-frequency module 6 includes the power amplifier circuit 1, a PA control circuit 10, a low-noise amplifier 30, duplexers 61 and 62, a diplexer 60, matching circuits 41 and 42, and switches 71, 72, and 73. The radio-frequency module 6 transfers a radio-frequency signal between the antenna 2 and the RFIC 3. The configuration of the power amplifier circuit 1 will be discussed later with reference to FIG. 2.

The antenna 2 is connected to an antenna connection terminal 100 of the radio-frequency module 6 and transmits a radio-frequency signal output from the radio-frequency module 6. The antenna 2 also receives a radio-frequency signal from an external source and outputs it to the radio-frequency module 6.

The RFIC 3 is an example of a signal processing circuit that processes a radio-frequency signal. The RFIC 3 will be explained below more specifically. The RFIC 3 performs signal processing, such as down-conversion, on a radio-frequency reception signal, which is received via a receive path of the radio-frequency module 6, and outputs the resulting reception signal to the BBIC 4. The RFIC 3 also performs signal processing, such as up-conversion, on a transmission signal output from the BBIC 4 and outputs the resulting radio-frequency transmission signal to a transmit path of the radio-frequency module 6. The RFIC 3 includes a controller that controls the radio-frequency module 6. All or some of the functions of the RFIC 3 as the controller may be disposed outside the RFIC 3, such as in the BBIC 4 or the radio-frequency module 6.

The BBIC 4 is a baseband signal processing circuit that performs signal processing by using an intermediate frequency band, which is lower than a radio-frequency signal transferred by the radio-frequency module 6. Examples of signals to be processed by the BBIC 4 are image signals for displaying images and/or audio signals for communication performed via a speaker.

The power supply circuit 5 supplies a power supply voltage $V_{ET}$ to the power amplifier circuit 1. The configuration of the power supply circuit 5 will be discussed later with reference to FIG. 2.

The circuit configuration of the communication device 7 shown in FIG. 1 is an example and does not restrict the configuration of the communication device 7. In one example, the provision of the antenna 2 and/or the BBIC 4 in the communication device 7 may be omitted. In another example, the communication device 7 may include plural antennas.

[1.2 Circuit Configuration of Radio-Frequency Module 6]

The circuit configuration of the radio-frequency module 6 will now be described below.

The power amplifier circuit 1 includes an input terminal 120 to which a radio-frequency transmission signal is input and an output terminal 110 from which a radio-frequency transmission signal (hereinafter called a transmission signal) is output.

The PA control circuit 10, which is an example of a control circuit, receives a control signal from the RFIC 3 via a control terminal 130 so as to control the magnitude and the supply timing of a bias current to be supplied to the power amplifier circuit 1.

The switch 71 is connected between the antenna connection terminal 100 and the duplexers 61 and 62. The switch 71 has terminals 71a, 71b, and 71c. The terminal 71a is connected to the antenna connection terminal 100 via the diplexer 60. The terminal 71b is connected to the duplexer 61. The terminal 71c is connected to the duplexer 62.

With this connection configuration, the switch 71 can connect the terminal 71a to one of the terminals 71b and 71c based on a control signal from the RFIC 3, for example. That is, the switch 71 can selectively connect the antenna connection terminal 100 to one of the duplexers 61 and 62. The switch 71 is constituted by an SPDT (Single-Pole Double-Throw) switch circuit, for example.

The switch 72 is connected between transmit filters 61T and 62T and the power amplifier circuit 1. The switch 72 has terminals 72a, 72b, and 72c. The terminal 72a is connected to the output terminal 110. The terminal 72b is connected to the transmit filter 61T. The terminal 72c is connected to the transmit filter 62T.

With this connection configuration, the switch 72 can connect the terminal 72a to one of the terminals 72b and 72c, based on a control signal from the RFIC 3, for example. That is, the switch 72 can selectively connect the power amplifier circuit 1 to one of the transmit filters 61T and 62T. The switch 72 is constituted by an SPDT switch circuit, for example.

The switch 73 is connected between receive filters 61R and 62R and the low-noise amplifier 30. The switch 73 has terminals 73a, 73b, and 73c. The terminal 73a is connected to the low-noise amplifier 30. The terminal 73b is connected to the receive filter 61R. The terminal 73c is connected to the receive filter 62R.

With this connection configuration, the switch 73 can connect the terminal 73a to one of the terminals 73b and 73c, based on a control signal from the RFIC 3, for example. That is, the switch 73 can selectively connect the low-noise amplifier 30 to one of the receive filters 61R and 62R. The switch 73 is constituted by an SPDT switch circuit, for example.

The duplexer 61 has a pass band including band A. The duplexer 61 includes the transmit filter 61T and the receive filter 61R and enables frequency division duplex (FDD) in band A.

The transmit filter 61T (A-Tx) is connected between the power amplifier circuit 1 and the antenna connection terminal 100. More specifically, one end of the transmit filter 61T is connected to the output terminal 110 via the switch 72, while the other end of the transmit filter 61T is connected to the antenna connection terminal 100 via the switch 71 and the diplexer 60. The transmit filter 61T has a pass band including the uplink operating band of band A. The transmit filter 61T can thus allow, among transmission signals amplified by the power amplifier circuit 1, a transmission signal of band A to pass therethrough.

The receive filter 61R (A-Rx) is connected between the low-noise amplifier 30 and the antenna connection terminal 100. More specifically, one end of the receive filter 61R is connected to the antenna connection terminal 100 via the switch 71 and the diplexer 60, while the other end of the receive filter 61R is connected to the low-noise amplifier 30 via the switch 73. The receive filter 61R has a pass band including the downlink operating band of band A. The receive filter 61R can thus allow, among reception signals received by the antenna 2, a reception signal of band A to pass therethrough.

The duplexer 62 has a pass band including band B. The duplexer 62 includes the transmit filter 62T and the receive filter 62R and enables FDD in band B.

The transmit filter 62T (B-Tx) is connected between the power amplifier circuit 1 and the antenna connection terminal 100. More specifically, one end of the transmit filter 62T is connected to the output terminal 110 via the switch 72, while the other end of the transmit filter 62T is connected to the antenna connection terminal 100 via the switch 71 and the diplexer 60. The transmit filter 62T has a pass band including the uplink operating band of band B. The transmit filter 62T can thus allow, among transmission signals amplified by the power amplifier circuit 1, a transmission signal of band B to pass therethrough.

The receive filter 62R (B-Rx) is connected between the low-noise amplifier 30 and the antenna connection terminal 100. More specifically, one end of the receive filter 62R is connected to the antenna connection terminal 100 via the switch 71 and the diplexer 60, while the other end of the receive filter 62R is connected to the low-noise amplifier 30 via the switch 73. The receive filter 62R has a pass band including the downlink operating band of band B. The receive filter 62R can thus allow, among reception signals received by the antenna 2, a reception signal of band B to pass therethrough.

Band A and band B are frequency bands to be used for a communication system constructed using a radio access technology (RAT). Band A and band B are predefined by a standardizing body (such as 3GPP (registered trademark) (3rd Generation Partnership Project) and IEEE (Institute of Electrical and Electronics Engineers)). Examples of the communication system are a 5GNR (5th Generation New Radio) system, an LTE (Long Term Evolution) system, and a WLAN (Wireless Local Area Network) system.

The diplexer 60 includes a high pass filter 60H and a low pass filter 60L. One terminal of the high pass filter 60H and one terminal of the low pass filter 60L are connected to the antenna connection terminal 100. The other terminal of the low pass filter 60L is connected to a terminal 71a. The low pass filter 60L is a filter having a pass band including a first frequency band group containing band A and band B. The high pass filter 60H is a filter having a pass band including a second frequency band group, which is higher than the first frequency band group. The other end of the high pass filter 60H may alternatively be connected to the terminal 71a, and the other end of the low pass filter 60L may alternatively be connected to another circuit element. The provision of the diplexer 60 may be omitted.

The matching circuit 41 is connected between the power amplifier circuit 1 and the switch 72. The matching circuit 41 provides impedance matching between the output impedance of the power amplifier circuit 1 and the input impedance of the transmit filters 61T and 62T. The matching circuit 41 is constituted by at least one of an inductor and a capacitor, for example.

The matching circuit 42 is connected between the low-noise amplifier 30 and the switch 73. The matching circuit 42 provides impedance matching between the input impedance of the low-noise amplifier 30 and the output impedance of the receive filters 61R and 62R. The matching circuit 42 is constituted by at least one of an inductor and a capacitor, for example.

The provision of the matching circuits 41 and 42 may be omitted. A matching circuit may be provided between the antenna connection terminal 100 and the duplexer 61 and between the antenna connection terminal 100 and the duplexer 62.

The radio-frequency module 6 shown in FIG. 1 is an example and does not restrict the configuration of the radio-frequency module 6. In one example, the provision of the duplexer 62 and the switches 71 through 73 in the radio-frequency module 6 may be omitted. Additionally, the provision of the receive path and the low-noise amplifier 30 and the receive filter 61R in the radio-frequency module 6 may be omitted. In another example, the radio-frequency module 6 may include a filter and a power amplifier circuit supporting band C, which is different from band A and band B.

[1.3 Circuit Configuration of Power Amplifier Circuit 1 and Power Supply Circuit 5]

The circuit configurations of the power amplifier circuit 1 and the power supply circuit 5 will now be described below. As illustrated in FIG. 2, the power amplifier circuit 1 includes the input terminal 120, the output terminal 110, a carrier amplifier 11, peaking amplifiers 12, 13, and 14, a preamplifier 15, a phase shifter circuit 70, ¼-wavelength transmission lines 22 and 24, and transformers 26 and 27.

The input terminal 120 is a terminal for receiving a radio-frequency signal output from the RFIC 3. The output terminal 110 is an example of a signal output terminal and is a terminal for outputting a radio-frequency signal.

The preamplifier 15 amplifies a radio-frequency signal of band A and/or a radio-frequency signal of band B input from the input terminal 120.

The phase shifter circuit 70 distributes a signal RF0 output from the preamplifier 15 and outputs the distributed four signals RF1, RF2, RF3, and RF4 to the carrier amplifier 11 and the peaking amplifiers 12 through 14, respectively. Based on outputting the distributed signals RF1, RF2, RF3, and RF4, the phase shifter circuit 70 adjusts the phases of the signals RF1, RF2, RF3, and RF4. For example, the phase shifter circuit 70 shifts the signal RF1 by +90 degrees (advances the signal RF1 by 90 degrees) with respect to the signal RF0, shifts the signal RF2 by 0 degrees (does not shift the signal RF2) with respect to the signal RF0, shifts the signal RF3 by +90 degrees (advances the signal RF3 by 90 degrees) with respect to the signal RF0, and shifts the signal RF4 by 0 degrees (does not shift the signal RF4) with respect to the signal RF0.

The configurations of the preamplifier 15 and the phase shifter circuit 70 are not restricted to the above-described configurations. In one example, the preamplifier 15 may be disposed at the stage prior to each of the carrier amplifier 11 and the peaking amplifiers 12 through 14. In this case, the phase shifter circuit 70 may be disposed at the stage prior to each of the preamplifiers or at the stage prior to each of the carrier amplifier 11 and the peaking amplifiers 12 through 14. In another example, the provision of the preamplifier 15 and the phase shifter circuit 70 in the power amplifier circuit 1 may be omitted.

Each of the carrier amplifier 11 and the peaking amplifiers 12 through 14 includes an amplifying transistor. The amplifying transistor is a bipolar transistor, such as a heterojunction bipolar transistor (HBT), or a field effect transistor, such as a MOSFET (Metal-Oxide-Semiconductor Field Effect Transistor).

The carrier amplifier 11 is an example of a first amplifying element. The carrier amplifier 11 is a Class A (or class AB) amplifier circuit that is operable for all the power levels of the signal RF1 and is operable with high efficiency especially in the low and intermediate output regions. The first amplifying element in the disclosure is not restricted to a carrier amplifier assuming it is a Class A (or Class AB) amplifier circuit.

The peaking amplifier 12 is an example of a second amplifying element. The peaking amplifier 13 is an example of a third amplifying element. The peaking amplifier 14 is an example of a fourth amplifying element. The peaking amplifiers 12, 13, and 14 are Class C amplifier circuits, for example, which are operable in regions where the power levels of the signals RF2, RF3, and RF4 are high. A bias voltage lower than that to be applied to the amplifying transistor of the carrier amplifier 11 is applied to the amplifying transistors of the peaking amplifiers 12 through 14. Hence, as the power levels of the signals RF2, RF3, and RF4 become higher, the output impedance becomes lower. For this reason, the peaking amplifiers 12 through 14 can perform amplification with low distortion in a high output region. The second, third, and fourth amplifying elements in the disclosure are not restricted to peaking amplifiers assuming they are Class C amplifier circuits.

The transformer 26 is an example of a first transformer and includes an input coil 261 (first input coil) and an output coil 262 (first output coil).

The transformer 27 is an example of a second transformer and includes an input coil 271 (second input coil) and an output coil 272 (second output coil).

The ¼-wavelength transmission line 22, which is an example of a first phase shifter circuit, delays the phase of a radio-frequency signal input from one end of the ¼-wavelength transmission line 22 by a ¼ wavelength and outputs the resulting radio-frequency signal from the other end of the ¼-wavelength transmission line 22. The ¼-wavelength transmission line 24, which is an example of a second phase shifter circuit, delays the phase of a radio-frequency signal input from one end of the ¼-wavelength transmission line 24 by a ¼ wavelength and outputs the resulting radio-frequency signal from the other end of the ¼-wavelength transmission line 24.

One end of the output coil 262 is connected to the output terminal 110. The output terminal of the carrier amplifier 11 is connected to one end of the input coil 261. The output terminal of the peaking amplifier 12 is connected to one end of the ¼-wavelength transmission line 22. The output terminal of the peaking amplifier 13 is connected to one end of the input coil 271. The output terminal of the peaking amplifier 14 is connected to one end of the ¼-wavelength transmission line 24. The other end of the ¼-wavelength transmission line 22 is connected to the other end of the input coil 261. The other end of the ¼-wavelength transmission line 24 is connected to the other end of the input coil 271. One end of the output coil 272 is connected to the other end of the output coil 262, and the other end of the output coil 272 is connected to a ground.

With the above-described configuration, the power amplifier circuit 1 can operate as a Doherty amplifier circuit, and with the provision of the three peaking amplifiers 12 through 14 for one carrier amplifier 11, a large amount of back-off can be secured. For the provision of the four amplifiers, that is, the carrier amplifier 11 and the peaking amplifiers 12 through 14, four transformers are not provided, but the two transformers 26 and 27 and the two ¼-wavelength transmission lines 22 and 24 are disposed. It is thus possible to implement a small-sized power amplifier circuit 1 having a large amount of back-off.

The power amplifier circuit 1 of the embodiment may include two or more carrier amplifiers and/or five or more peaking amplifiers.

The operation of the power amplifier circuit 1 will be discussed later with reference to FIGS. 3A through 3D.

The power supply circuit 5 includes a power supply 54, an analog ET tracker 51, a digital ET tracker 52, a switch 53, and a power supply control circuit 50.

The digital ET tracker 52 generates a power supply voltage of multiple discrete voltage levels, based on the voltage of the power supply 54. More specifically, the digital ET tracker 52, which includes plural voltage retaining circuits (or voltage retaining elements) that retain individual voltage levels different from each other, selects one of the voltage retaining circuits and outputs the power supply voltage of the voltage level retained by the selected voltage retaining circuit. It is optional that the digital ET tracker 52 presets multiple voltage levels and selects and outputs a voltage level by using a switch. For example, the digital ET tracker 52 may generate a voltage level, which is a voltage level selected from multiple discrete voltage levels, and output the generated voltage level.

The analog ET tracker 51 generates a power supply voltage of continuous voltage levels, based on the voltage of the power supply 54. More specifically, the analog APT tracker 51, which includes a voltage retaining circuit that retains a voltage whose level is variable, changes the level of the voltage retained in the voltage retaining circuit and outputs the resulting power supply voltage.

The switch 53 has a common terminal connected to the power amplifier circuit 1, a first selection terminal connected to the analog ET tracker 51, and a second selection terminal connected to the digital ET tracker 52. The switch 53 switches between the connection of the analog ET tracker 51 to the power amplifier circuit 1 and the connection of the digital ET tracker 52 to the power amplifier circuit 1.

Based on the envelope signal of a radio-frequency input signal obtained from the BBIC 4, the power supply control circuit 50 selects the voltage level of a power supply voltage $V_{ET}$ to be used in the power amplifier circuit 1 from among multiple discrete voltage levels generated in the digital ET tracker 52 and also continuously changes the voltage level of a power supply voltage $V_{ET}$ to be used in the analog ET tracker 51. The power supply control circuit 50 also switches the connection of the switch 53 based on the frequency and the channel bandwidth of a radio-frequency signal to be input into the power amplifier circuit 1.

The envelope signal is a signal indicating the envelope of a radio-frequency input signal (modulated signal). The envelope value is represented by $\sqrt{(i^2+Q^2)}$, for example. (i, Q) is a constellation point. The constellation point is a point of a digital modulated signal on a constellation diagram. (i, Q) is determined by the BBIC 4 based on transmission information, for example.

The power supply control circuit 50 may be disposed in the RFIC 3 instead of in the power supply circuit 5.

Hereinafter, tracking the envelope of a radio-frequency signal by the use of multiple discrete voltage levels within a frame will be called digital envelope tracking (hereinafter called digital ET), and a mode in which digital ET is applied to a power supply voltage will be called a digital ET mode. Tracking the envelope of a radio-frequency signal by the use of continuous voltage levels will be called analog envelope tracking (hereinafter called analog ET), and a mode in which analog ET is applied to a power supply voltage will be called an analog ET mode.

A frame is a unit which forms a radio-frequency signal (modulated signal). For example, 5GNR and LTE define that a frame includes ten subframes, each subframe includes plural slots, and each slot is constituted by plural symbols. The subframe length is 1 ms, and the frame length is 10 ms.

It is optional that the power supply circuit 5 has a configuration in which the analog ET mode and the digital ET mode are switched therebetween. For example, the provision of the analog ET tracker 51 and the switch 53 may be omitted.

[1.4 Operation of Power Amplifier Circuit 1]

The operation of the power amplifier circuit 1 according to the embodiment will now be discussed below.

Figure 3A:
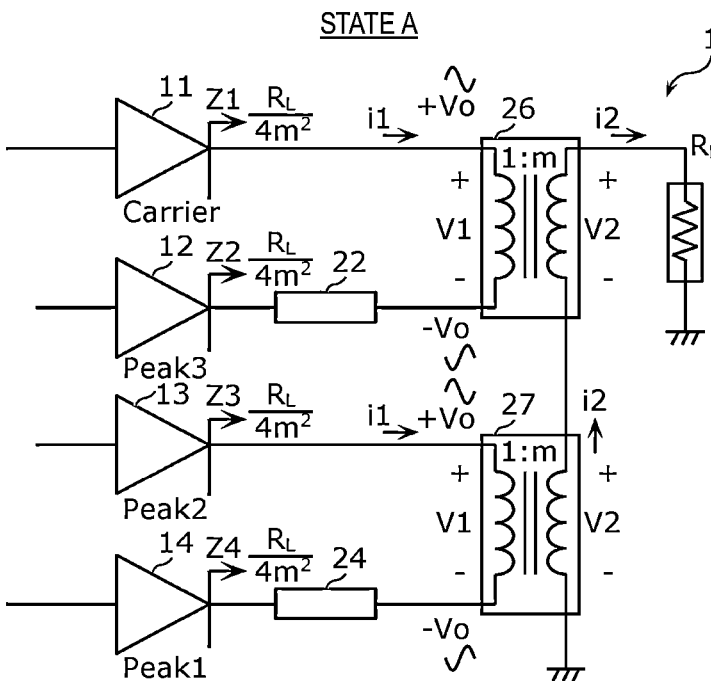
FIG. 3A is a circuit state diagram of the power amplifier circuit of the embodiment assuming a first signal is input (state A).

FIG. 3A is a circuit state diagram of the power amplifier circuit 1 of the embodiment assuming a first signal is input (state A). State A is a state in which the power level of a radio-frequency signal input into the input terminal 120 is a first power value. In this case, as shown in FIG. 3A, the carrier amplifier 11 and the peaking amplifiers 12 through 14 are operated (ON). In this state, the impedance Z1 seen from the output terminal of the carrier amplifier 11 toward the load (hereinafter called the impedance Z1 of the carrier amplifier 11), the impedance Z2 seen from the output terminal of the peaking amplifier 12 toward the load (hereinafter called the impedance Z2 of the peaking amplifier 12), the impedance Z3 seen from the output terminal of the peaking amplifier 13 toward the load (hereinafter called the impedance Z3 of the peaking amplifier 13), and the impedance Z4 seen from the output terminal of the peaking amplifier 14 toward the load (hereinafter called the impedance Z4 of the peaking amplifier 14) are represented by equation 1. It is assumed that the transformers 26 and 27 each perform voltage transformation at a ratio of 1:m. In equation 1 and FIG. 3A, V1 is a voltage applied across the input coil 261 and a voltage across the input coil 271, V2 is a voltage applied across the output coil 262 and a voltage across the output coil 272, i1 is a current flowing through the input coil 261 and a current through the input coil 271, i2 is a current flowing through the output coil 262 and a current through the output coil 272, Vo is the output voltage of each amplifier, and $R_L$ is the impedance of the load connected to the output terminal 110.

[Math. 1]

$$V2 = mV1 = 2mVo, \ i2 = \frac{1}{m}i1 \qquad \text{(Equation 1)}$$
$$R_L = \frac{V2 + V2}{i2} = \frac{4 \ m^2 Vo}{i1}$$
$$Z1 = Z2 = Z3 = Z4 = \frac{Vo}{i1} = \frac{R_L}{4 \ m^2}$$

Figure 3B:
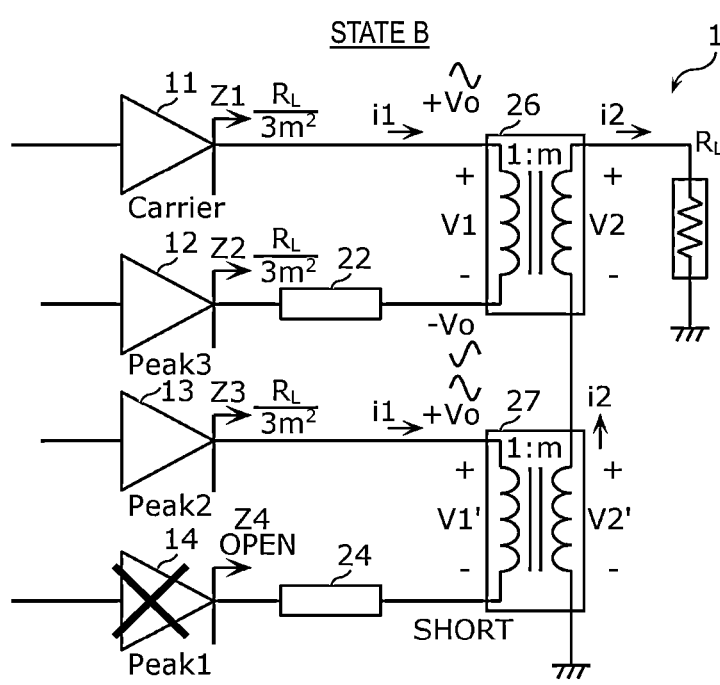
FIG. 3B is a circuit state diagram of the power amplifier circuit of the embodiment assuming a second signal is input (state B).

FIG. 3B is a circuit state diagram of the power amplifier circuit 1 of the embodiment assuming a second signal is input (state B). State B is a state in which the power level of a radio-frequency signal input into the input terminal 120 is a second power value, which is smaller than the first power value. In this case, as shown in FIG. 3B, the carrier amplifier 11 and the peaking amplifiers 12 and 13 are operated (ON), while the peaking amplifier 14 is not operated (OFF). In this state, the impedances Z1 through Z3 are represented by equation 2. The impedance Z4 is in the open state. The impedance of the other end of the input coil 271 is in the short state because of the ¼-wavelength transmission line 24. In equation 2 and FIG. 3B, V1 is a voltage applied across the input coil 261, V1' is a voltage applied across the input coil 271, V2 is a voltage applied across the output coil 262, V2' is a voltage applied across the output coil 272.

[Math. 2]

$$V2 = mV1 = 2mVo, \ V2' = mV1' = mVo, \ i2 = \frac{1}{m}i1 \qquad \text{(Equation 2)}$$
$$R_L = \frac{V2 + V2'}{i2} = \frac{3 \ m^2 Vo}{i1}$$
$$Z1 = Z2 = Z3 = \frac{Vo}{i1} = \frac{R_L}{3 \ m^2}$$

Figure 3C:
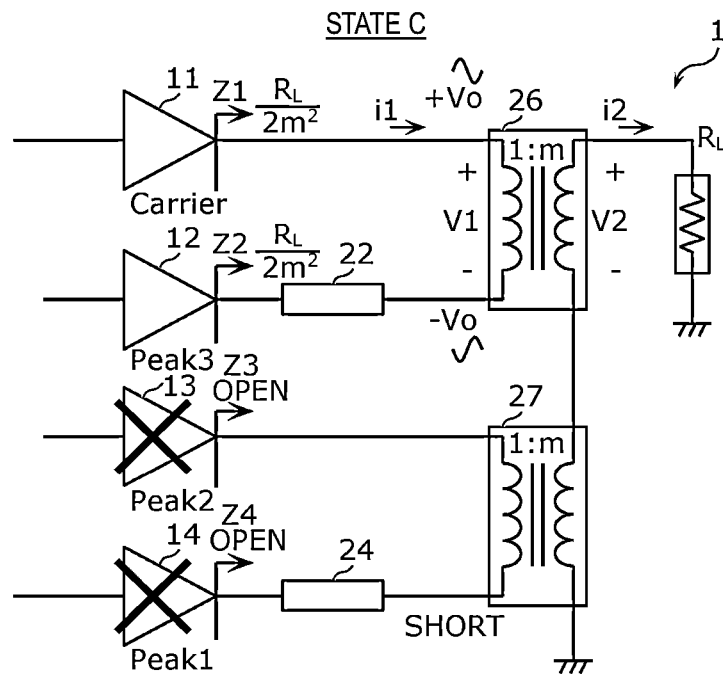
FIG. 3C is a circuit state diagram of the power amplifier circuit of the embodiment assuming a third signal is input (state C).

FIG. 3C is a circuit state diagram of the power amplifier circuit 1 of the embodiment assuming a third signal is input (state C). State C is a state in which the power level of a radio-frequency signal input into the input terminal 120 is a third power value, which is smaller than the second power value. In this case, as shown in FIG. 3C, the carrier amplifier 11 and the peaking amplifier 12 are operated (ON), while the peaking amplifiers 13 and 14 are not operated (OFF). In this state, the impedances Z1 and Z2 are represented by equation 3. The impedances Z3 and Z4 are in the open state. The impedance of the other end of the input coil 271 is in the short state because of the ¼-wavelength transmission line 24. In equation 3 and FIG. 3C, V1 is a voltage applied across the input coil 261, and V2 is a voltage applied across the output coil 262.

[Math. 3]

$$V2 = mV1 = 2mVo, \ i2 = \frac{1}{m}i1 \qquad \text{(Equation 3)}$$
$$R_L = \frac{V2}{i2} = \frac{2 \ m^2 Vo}{i1}$$
$$Z1 = Z2 = \frac{Vo}{i1} = \frac{R_L}{2 \ m^2}$$

Figure 3D:
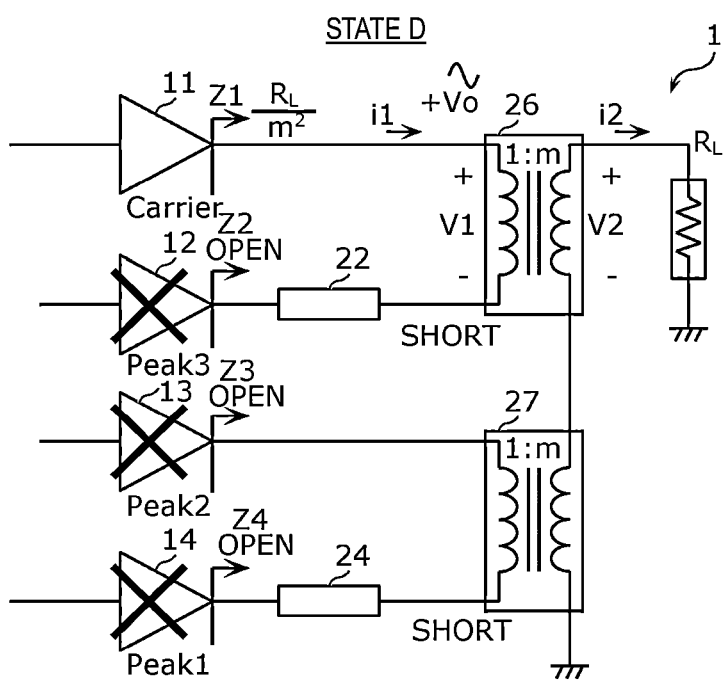
FIG. 3D is a circuit state diagram of the power amplifier circuit of the embodiment assuming a fourth signal is input (state D).

FIG. 3D is a circuit state diagram of the power amplifier circuit 1 of the embodiment assuming a fourth signal is input (state D). State D is a state in which the power level of a radio-frequency signal input into the input terminal 120 is a fourth power value, which is smaller than the third power value. In this case, as shown in FIG. 3D, the carrier amplifier 11 is operated (ON), while the peaking amplifiers 12 through 14 are not operated (OFF). In this state, the impedance Z1 is represented by equation 4. The impedances Z2 through Z4 are in the open state. The impedance of the other end of the input coil 261 is in the short state because of the ¼-wavelength transmission line 22, and the impedance of the other end of the input coil 271 is in the short state because of the ¼-wavelength transmission line 24. In equation 4 and FIG. 3D, V1 is a voltage applied across the input coil 261, and V2 is a voltage applied across the output coil 262.

[Math. 4]

$$V2 = mV1 = mVo, \ i2 = \frac{1}{m}i1 \qquad \text{(Equation 4)}$$
$$R_L = \frac{V2}{i2} = \frac{m^2 Vo}{i1}$$
$$Z1 = \frac{Vo}{i1} = \frac{R_L}{m^2}$$

Figure 4:
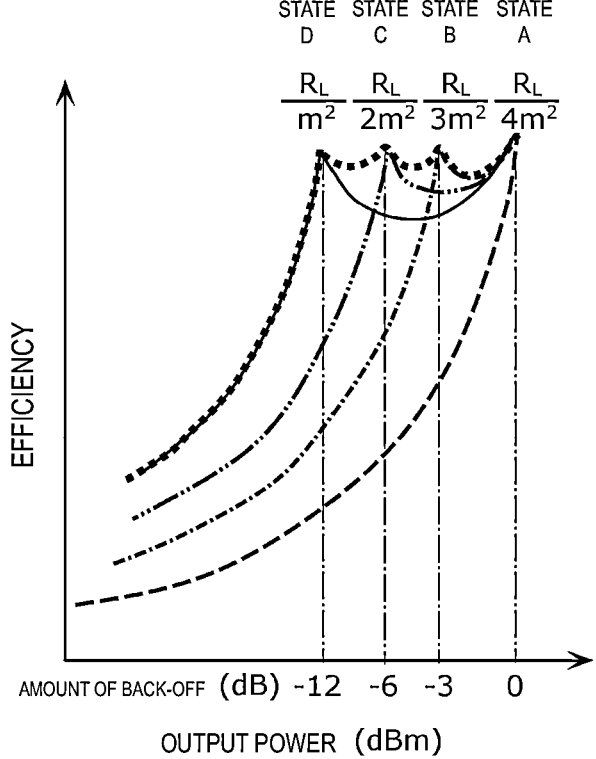
FIG. 4 is a graph illustrating the relationship between output power and efficiency of the power amplifier circuit according to the embodiment.

FIG. 4 is a graph illustrating the relationship between output power and efficiency of the power amplifier circuit 1 according to the embodiment. In FIG. 4, the horizontal axis indicates the power level of a signal output from the output terminal 110, and the vertical axis indicates the efficiency (power-added efficiency) of the power amplifier circuit 1.

Assuming the power level of a radio-frequency input signal drops from the first power value (state A) to the second power value (state B), the impedances of the carrier amplifier 11 and the peaking amplifiers 12 and 13, which are in the ON state, are increased, as represented by equation 1 and equation 2. In state B, therefore, the efficiency becomes higher than a situation where the carrier amplifier 11 and the peaking amplifiers 12 through 14 are in the ON state.

Assuming the power level of the radio-frequency input signal drops from the second power value (state B) to the third power value (state C), the impedances of the carrier amplifier 11 and the peaking amplifier 12, which are in the ON state, is further increased, as represented by equation 2 and equation 3. In state C, therefore, the efficiency becomes higher than a situation where the carrier amplifier 11 and the peaking amplifiers 12 and 13 are in the ON state.

Assuming the power level of the radio-frequency input signal drops from the third power value (state C) to the fourth power value (state D), the impedance of the carrier amplifier 11, which is in the ON state, is further increased. In state D, therefore, the efficiency becomes higher than a situation where the carrier amplifier 11 and the peaking amplifier 12 are in the ON state.

That is, assuming the level of an input signal shifts from a high level to a low level, the peaking amplifiers 14, 13, and 12 are sequentially turned OFF in this order, and the impedances of the carrier amplifier 11 and a peaking amplifier/peaking amplifiers, which are in the ON state, become higher. This enables the power amplifier circuit 1 to operate with high efficiency in a low output region. Additionally, the peaking amplifiers 12 through 14 are changed to the OFF state in stages. This can secure a large amount of back-off, which is a difference between a certain combination of output power assuming the peaking amplifiers 12 through 14 are ON (state A), output power assuming the peaking amplifiers 12 and 13 are ON (state B), output power assuming the peaking amplifier 12 is ON (state C), and output power assuming the peaking amplifiers 12 through 14 are OFF (state D).

As the level of an input signal shifts from a low level to a high level, the peaking amplifier 12 is first turned ON, and then, the peaking amplifier 13 is turned ON, and then, the peaking amplifier 14 is turned ON. To implement this order, the magnitude of a bias current supplied to each amplifier may be that represented by "peaking amplifier 12>peaking amplifier 13>peaking amplifier 14". That is, the bias current supplied to the peaking amplifier 13 may be higher than that to the peaking amplifier 14, and the bias current supplied to the peaking amplifier 12 may be higher than that to the peaking amplifier 13.

The size of each of the peaking amplifiers 12 through 14 may be larger than that of the carrier amplifier 11.

This can elevate saturated power (intercept point) of the peaking amplifiers 12 through 14, thereby further increasing the amount of back-off of the power amplifier circuit 1.

The size of an amplifier is dependent on the number of stages of transistors forming the amplifier, the number of cells of the transistors, or the number of fingers of the transistors. Accordingly, assuming the sizes of amplifiers are different, the number of stages of transistors, the number of cells of the transistors, or the number of fingers of the transistors of one amplifier and that of the other amplifier are different.

The size of the peaking amplifier 14 may be larger than that of the peaking amplifier 13.

This can make saturated power (intercept point) of the peaking amplifier 14 higher than that of the peaking amplifier 13. This can improve the efficiency, especially in a higher output region (output region from state A to state B) among output regions from state A to state D, for example.

[1.5 Amplification Characteristics of Power Amplifier Circuit 1 in Digital ET Mode]

The digital ET mode and the analog ET mode will be explained below with reference to FIGS. 5A and 5B.

Figure 5A:
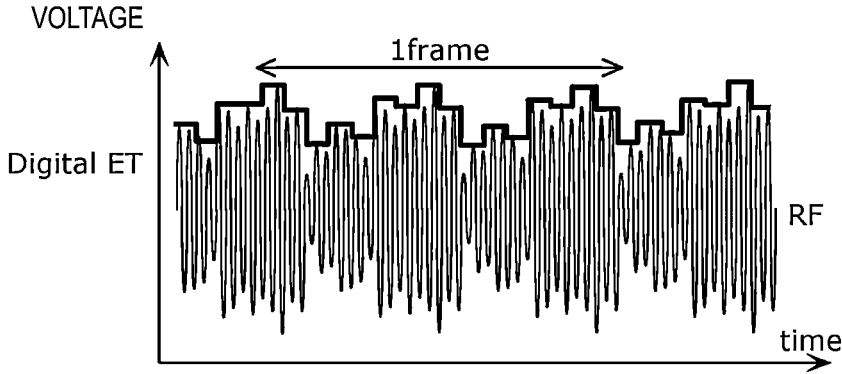
FIG. 5A is a graph illustrating an example of the transition of a power supply voltage in a digital ET mode.

FIG. 5A is a graph illustrating an example of the transition of a power supply voltage in the digital ET mode. FIG. 5B is a graph illustrating an example of the transition of a power supply voltage in the analog ET mode. In FIGS. 5A and 5B, the horizontal axis indicates the time, and the vertical axis indicates the voltage. The thick solid line represents the power supply voltage $V_{ET}$, while the thin solid line (waveform) represents a modulated signal.

In the digital ET mode, as shown in FIG. 5A, the power supply voltage $V_{ET}$ is varied to multiple discrete voltage levels within one frame so as to track the envelope of the modulated signal. As a result, the power supply voltage signal forms a rectangular wave. In the digital ET mode, based on an envelope signal, the voltage level of a power supply voltage is selected from among multiple discrete voltage levels.

Figure 5B:
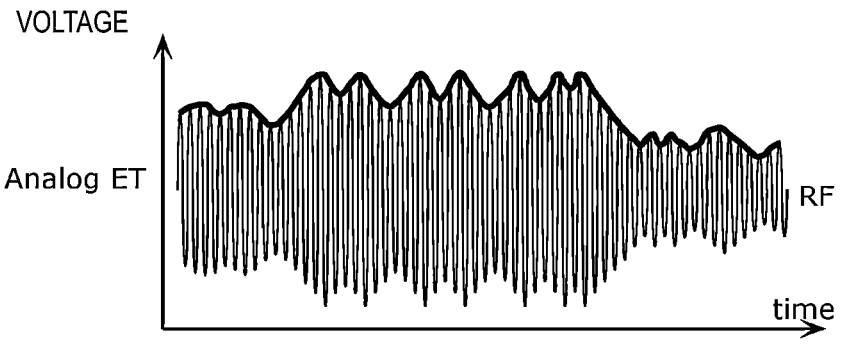
FIG. 5B is a graph illustrating an example of the transition of a power supply voltage in an analog ET mode.

In the analog ET mode, as shown in FIG. 5B, the power supply voltage $V_{ET}$ is continuously varied so as to track the envelope of the modulated signal. In the analog ET mode, the power supply voltage $V_{ET}$ is determined based on an envelope signal ($\sqrt{(i^2+Q^2)}$). In the analog ET mode, assuming the channel bandwidth is relatively small (lower than 60 MHz, for example), the power supply voltage $V_{ET}$ can follow a change in the envelope of a modulated signal, but assuming the channel bandwidth is relatively large (60 MHz or higher, for example), the power supply voltage $V_{ET}$ is unable to follow a change in the envelope of a modulated signal. In other words, assuming the channel bandwidth is relatively large, the amplitude change of the power supply voltage $V_{ET}$ tends to delay with respect to a change in the envelope of a modulated signal.

In contrast, assuming the channel bandwidth is relatively large (60 MHz or higher, for example), with the application of the digital ET mode, the followability of the power supply voltage $V_{ET}$ to the modulated signal is improved, as shown in FIG. 5A.

Figure 6:
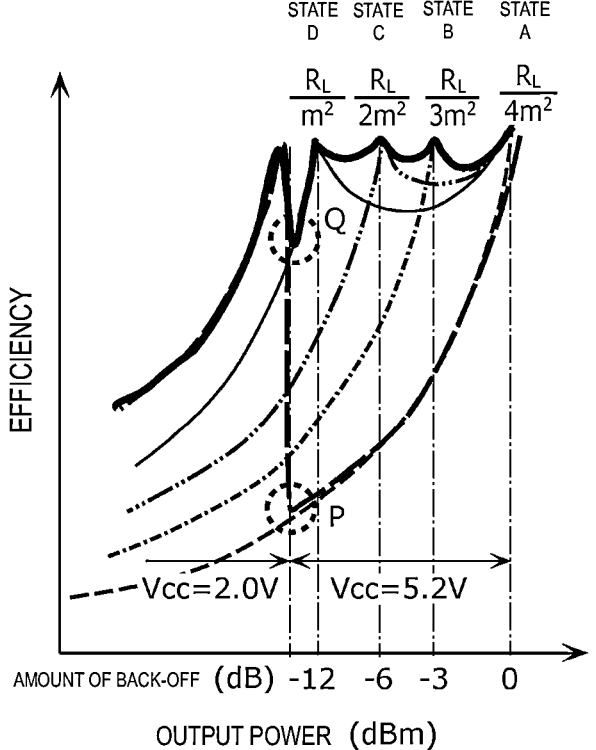
FIG. 6 is a graph illustrating the relationship between output power and efficiency assuming digital ET is applied to the power amplifier circuit of the embodiment and to a known power amplifier circuit.

FIG. 6 is a graph illustrating the relationship between output power and efficiency assuming digital ET is applied to the power amplifier circuit 1 of the embodiment and to a known power amplifier circuit. The known power amplifier circuit is an amplifier circuit constituted only by Class AB amplifiers.

With the application of digital ET, a radio-frequency signal having a large power dynamic range is input particularly based on a situation where a digital modulation method with a high PAPR (Peak to Average Power Ratio) is employed. Hence, in the known power amplifier circuit, at a changing point of the power supply voltage $V_{ET}$ (changing point from Vcc=5.2 V to Vcc=2.0 V, for example, in FIG. 6), a point at which the efficiently is significantly dropped (P in FIG. 6) is observed. In contrast, in the power amplifier circuit 1 of the embodiment, at a changing point of the power supply voltage $V_{ET}$ (changing point from Vcc=5.2 V to Vcc=2.0 V, for example, in FIG. 6), the efficiency is not considerably decreased (Q in FIG. 6).

That is, since the power amplifier circuit 1 of the embodiment has a large amount of back-off while maintaining high efficiency, it can regulate a decrease in efficiency even with the input of a radio-frequency signal using a digital modulation method having a high PAPR.

[1.6 Circuit Configurations of Power Amplifier Circuits 1A and 1B according to Modified Examples]

Figure 7A:
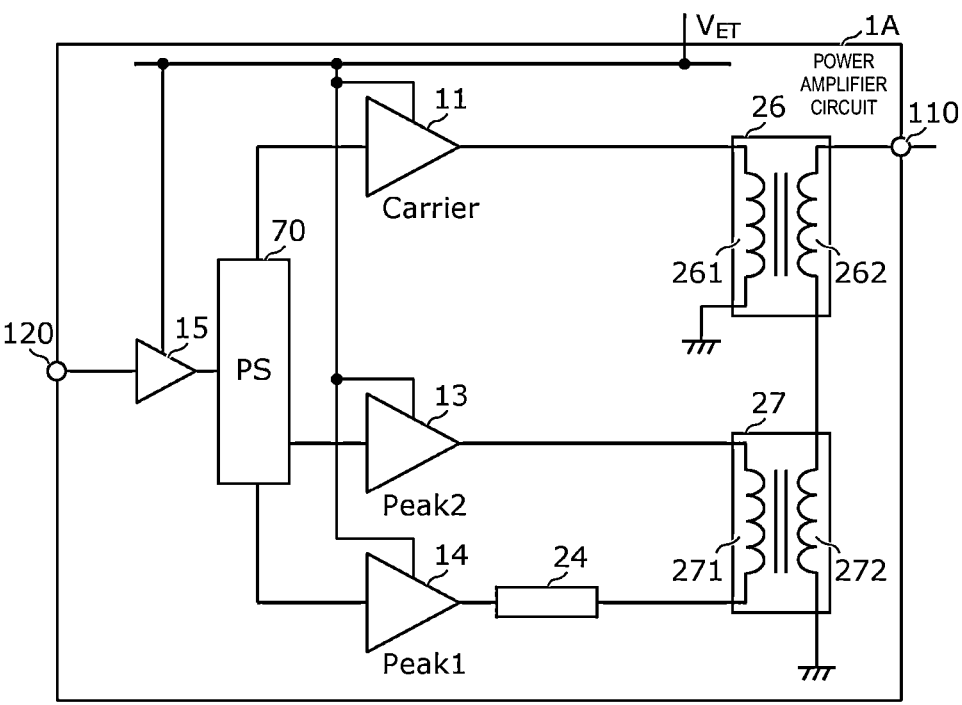
FIG. 7A is a circuit block diagram of a power amplifier circuit according to a first modified example of the embodiment.

FIG. 7A is a circuit block diagram of a power amplifier circuit 1A according to a first modified example of the embodiment. As illustrated in FIG. 7A, the power amplifier circuit 1A according to the first modified example includes an input terminal 120, an output terminal 110, a carrier amplifier 11, peaking amplifiers 13 and 14, a preamplifier 15, a phase shifter circuit 70, a ¼-wavelength transmission line 24, and transformers 26 and 27. The power amplifier circuit 1A of the first modified example is different from the power amplifier circuit 1 of the embodiment in that it does not include the peaking amplifier 12 and the ¼-wavelength transmission line 22. The power amplifier circuit 1A of the first modified example will be discussed below by mainly referring to the configuration different from the power amplifier circuit 1 of the embodiment while omitting an explanation of the same configuration.

The carrier amplifier 11 is an example of the first amplifying element. The carrier amplifier 11 is a Class A (or class AB) amplifier circuit that is operable with high efficiency especially in the low and intermediate output regions.

The peaking amplifier 13 is an example of the second amplifying element. The peaking amplifier 14 is an example of the third amplifying element. The peaking amplifiers 13 and 14 are Class C amplifier circuits, for example, which are operable in the high output region. The peaking amplifiers 13 and 14 can perform amplification with low distortion in the high output region.

The ¼-wavelength transmission line 24, which is an example of a phase shifter circuit, delays the phase of a radio-frequency signal input from one end of the ¼-wavelength transmission line 24 by a ¼ wavelength and outputs the resulting radio-frequency signal from the other end of the ¼-wavelength transmission line 24.

One end of the output coil 262 is connected to the output terminal 110. The output terminal of the carrier amplifier 11 is connected to one end of the input coil 261. The output terminal of the peaking amplifier 13 is connected to one end of the input coil 271. The output terminal of the peaking amplifier 14 is connected to one end of the ¼-wavelength transmission line 24. The other end of the ¼-wavelength transmission line 24 is connected to the other end of the input coil 271. The other end of the input coil 261 is connected to a ground. One end of the output coil 272 is connected to the other end of the output coil 262, and the other end of the output coil 272 is connected to a ground.

With the above-described configuration, the power amplifier circuit 1A can operate as a Doherty amplifier circuit, and with the provision of the two peaking amplifiers 13 and 14 for one carrier amplifier 11, a large amount of back-off can be secured. For the provision of the three amplifiers, that is, the carrier amplifier 11 and the peaking amplifiers 13 and 14, three transformers are not provided, but the two transformers 26 and 27 and one ¼-wavelength transmission line 24 are disposed. It is thus possible to implement a small-sized power amplifier circuit 1A having a large amount of back-off.

Figure 7B:
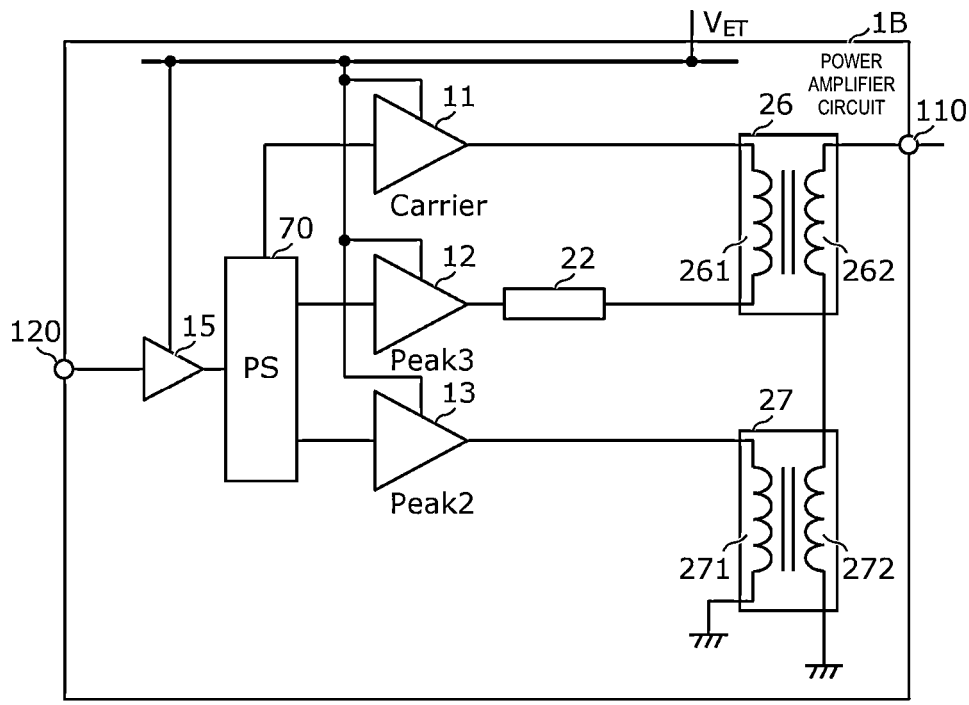
FIG. 7B is a circuit block diagram of a power amplifier circuit according to a second modified example of the embodiment.

FIG. 7B is a circuit block diagram of a power amplifier circuit 1B according to a second modified example of the embodiment. As illustrated in FIG. 7B, the power amplifier circuit 1B according to the second modified example includes an input terminal 120, an output terminal 110, a carrier amplifier 11, peaking amplifiers 12 and 13, a preamplifier 15, a phase shifter circuit 70, a ¼-wavelength transmission line 22, and transformers 26 and 27. The power amplifier circuit 1B of the second modified example is different from the power amplifier circuit 1 of the embodiment in that it does not include the peaking amplifier 14 and the ¼-wavelength transmission line 24. The power amplifier circuit 1B of the second modified example will be discussed below by mainly referring to the configuration different from the power amplifier circuit 1 of the embodiment while omitting an explanation of the same configuration.

The carrier amplifier 11 is an example of the first amplifying element. The carrier amplifier 11 is a Class A (or class AB) amplifier circuit that is operable with high efficiency especially in the low and intermediate output regions.

The peaking amplifier 12 is an example of the second amplifying element. The peaking amplifier 13 is an example of the third amplifying element. The peaking amplifiers 12 and 13 are Class C amplifier circuits, for example, which are operable in the high output region. The peaking amplifiers 12 and 13 can perform amplification with low distortion in the high output region.

The ¼-wavelength transmission line 22, which is an example of the phase shifter circuit, delays the phase of a radio-frequency signal input from one end of the ¼-wavelength transmission line 22 by a ¼ wavelength and outputs the resulting radio-frequency signal from the other end of the ¼-wavelength transmission line 22.

One end of the output coil 262 is connected to the output terminal 110. The output terminal of the carrier amplifier 11 is connected to one end of the input coil 261. The output terminal of the peaking amplifier 12 is connected to one end of the ¼-wavelength transmission line 22. The output terminal of the peaking amplifier 13 is connected to one end of the input coil 271. The other end of the ¼-wavelength transmission line 22 is connected to the other end of the input coil 261. The other end of the input coil 271 is connected to a ground. One end of the output coil 272 is connected to the other end of the output coil 262, and the other end of the output coil 272 is connected to a ground.

With the above-described configuration, the power amplifier circuit 1B can operate as a Doherty amplifier circuit, and with the provision of the two peaking amplifiers 12 and 13 for one carrier amplifier 11, a large amount of back-off can be secured. For the provision of the three amplifiers, that is, the carrier amplifier 11 and the peaking amplifiers 12 and 13, three transformers are not provided, but the two transformers 26 and 27 and one ¼-wavelength transmission line 22 are disposed. It is thus possible to implement a small-sized power amplifier circuit 1B having a large amount of back-off.

[2 Mounting Structure of Radio-Frequency Module 6]

The mounting structure of the radio-frequency module 6 of the embodiment will be discussed below with reference to FIG. 8.

Figure 8:
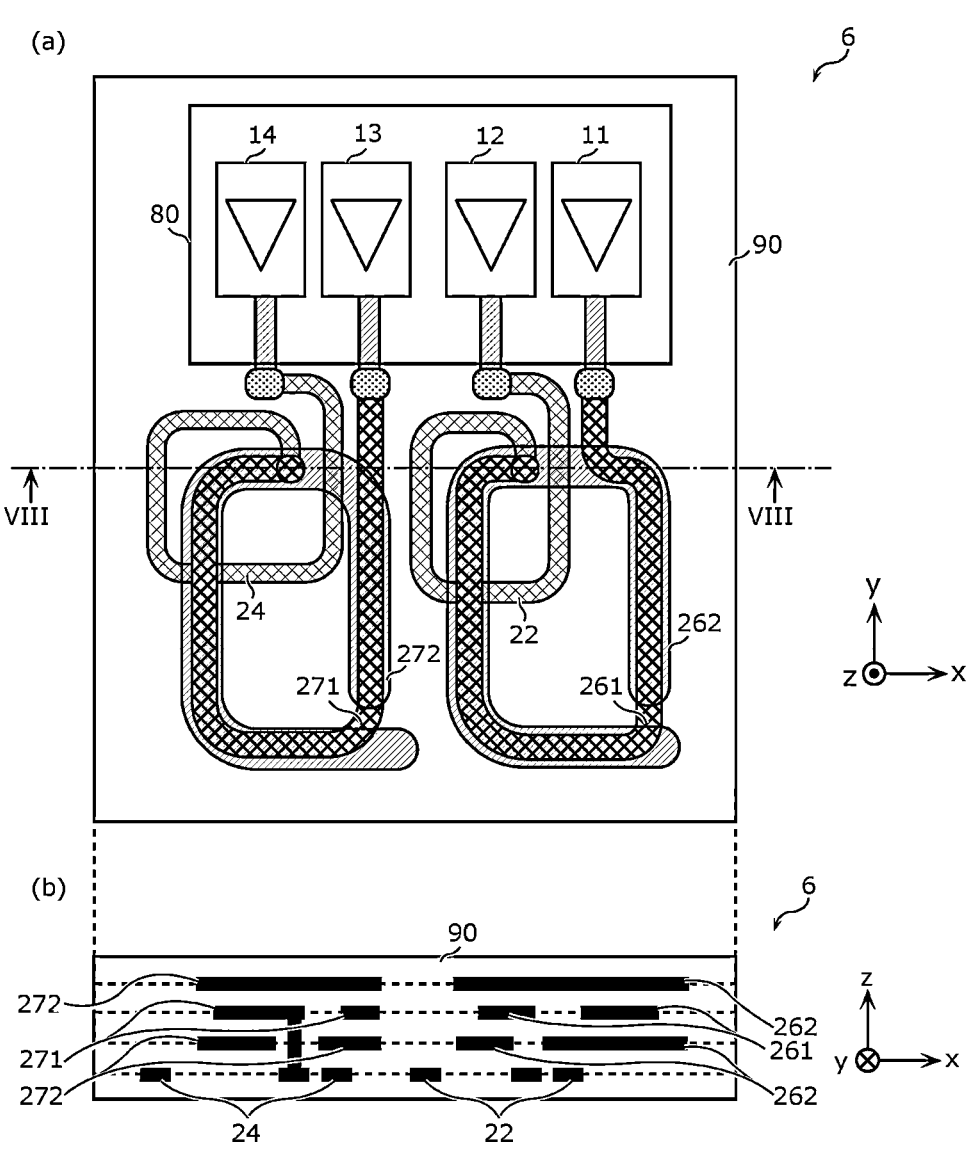
FIG. 8 shows a plan view and a sectional view of a radio-frequency module according to an example.

FIG. 8 shows a plan view and a sectional view of the radio-frequency module 6 according to an example. FIG. 8(a) is a plan view of the radio-frequency module 6 according to the example assuming the main surface of a substrate 90 is seen through from the positive side of the z axis. FIG. 8(b) is a sectional view of the radio-frequency module 6 according to the example. The cross section of the radio-frequency module 6 in FIG. 8(b) is a cross section taken along line VIII-VIII in FIG. 8(a). In FIG. 8(a), for easy understanding of the positional relationships between the carrier amplifier 11 and the peaking amplifiers 12 through 14, the symbol representing their function is appended. However, such a symbol is not appended to the actual amplifiers. In FIG. 8, lines for connecting the substrate 90 and the circuit components are not shown.

The radio-frequency module 6 may also include a resin member for covering the surfaces of the substrate 90 and some circuit components and a shield electrode layer for covering the surfaces of the resin member. In FIG. 8, such a resin member and a shield electrode layer are not shown.

In addition to the plural circuit components shown in FIG. 1, the radio-frequency module 6 also includes the substrate 90. The PA control circuit 10, low-noise amplifier 30, duplexers 61 and 62, diplexer 60, matching circuits 41 and 42, and switches 71 through 73 may be disposed in or on the substrate 90, though they are not shown in FIG. 8. At least circuit components forming the power amplifier circuit 1 may be mounted in or on the substrate 90.

The substrate 90 is a substrate for mounting circuit components forming the radio-frequency module 6 therein or thereon. As the substrate 90, a low temperature co-fired ceramics (LTCC) substrate or a high temperature co-fired ceramics (HTCC) substrate having a multilayer structure constituted by plural dielectric layers, a component-embedded board, a substrate having a redistribution layer (RDL), or a printed circuit board, for example, may be used.

On the surface of the substrate 90, the carrier amplifier 11, the peaking amplifiers 12 through 14, and capacitor elements, for example, are disposed.

The carrier amplifier 11 and the peaking amplifiers 12 through 14 are included in a semiconductor IC 80. The semiconductor IC 80 is disposed on the substrate 90. The semiconductor IC 80 may be constituted by a CMOS (Complementary Metal Oxide Semiconductor), for example, and more specifically, the semiconductor IC 80 may be manufactured by a SOI (Silicon on Insulator) process. The semiconductor IC 80 may be made of at least one of GaAs, SiGe, and GaN. The semiconductor material for the semiconductor IC 80 is not limited to the above-described materials. At least one of the preamplifier 15, phase shifter circuit 70, and switches 71 through 73 may be included in the semiconductor IC 80.

On the surface of or the inside of the substrate 90, the ¼-wavelength transmission lines 22 and 24, the transformer 26 (input coil 261 and output coil 262), and the transformer 27 (input coil 271 and output coil 272) are formed. The ¼-wavelength transmission lines 22 and 24, input coils 261 and 271, and output coils 262 and 272 are constituted by planar conductors formed on the surface of or the inside of the substrate 90. The ¼-wavelength transmission line 22, the input coil 261, and the output coil 262 may be formed on the same surface or on different surfaces of the substrate 90. The ¼-wavelength transmission line 24, the input coil 271, and the output coil 272 may be formed on the same surface or on different surfaces of the substrate 90. Each of the ¼-wavelength transmission lines 22 and 24, input coils 261 and 271, and output coils 262 and 272 may be distributed over multiple layers.

In a plan view of the substrate 90, a group of the carrier amplifier 11 and the peaking amplifier 12 and a group of the peaking amplifiers 13 and 14 are arranged in a first direction (x-axis direction). The transformer 26 (input coil 261 and output coil 262) and the ¼-wavelength transmission line 22 are arranged on the surface of or the inside of the substrate 90 in a second direction (y-axis direction), which is perpendicular to the first direction, on the side of the carrier amplifier 11 and the peaking amplifier 12. The transformer 27 (input coil 271 and output coil 272) and the ¼-wavelength transmission line 24 are arranged on the surface of or the inside of the substrate 90 in the second direction (y-axis direction) on the side of the peaking amplifiers 13 and 14.

With this configuration, the distance between a group of the carrier amplifier 11 and the peaking amplifier 12 and a group of the transformer 26 and the ¼-wavelength transmission line 22 can be made smaller, and the distance between a group of the peaking amplifiers 13 and 14 and a group of the transformer 27 and the ¼-wavelength transmission line 24 can be made smaller. It is thus possible to enhance the miniaturization of the radio-frequency module 6 while reducing transmission loss of the radio-frequency module 6.

3 Other Considerations

As described above, a power amplifier circuit 1 according to the embodiment includes first, second, third, and fourth amplifying elements, a transformer 26 including an input coil 261 and an output coil 262, a transformer 27 including an input coil 271 and an output coil 272, an output terminal 110 to which one end of the output coil 262 is connected, and ¼-wavelength transmission lines 22 and 24. The output terminal of the first amplifying element is connected to one end of the input coil 261. The output terminal of the second amplifying element is connected to one end of the ¼-wavelength transmission line 22. The output terminal of the third amplifying element is connected to one end of the input coil 271. The output terminal of the fourth amplifying element is connected to one end of the ¼-wavelength transmission line 24. The other end of the ¼-wavelength transmission line 22 is connected to the other end of the input coil 261. The other end of the ¼-wavelength transmission line 24 is connected to the other end of the input coil 271. One end of the output coil 272 is connected to the other end of the output coil 262, and the other end of the output coil 272 is connected to a ground.

With this configuration, due to the provision of the four amplifying elements, the power amplifier circuit 1 can secure a large amount of back-off. For the provision of the four amplifying elements, four transformers are not provided, but the two transformers 26 and 27 and the two ¼-wavelength transmission lines 22 and 24 are disposed. It is thus possible to implement a small-sized power amplifier circuit 1 having a large amount of back-off.

Additionally, for example, in the power amplifier circuit 1, the first amplifying element may be a carrier amplifier, the second amplifying element may be a peaking amplifier 12, the third amplifying element may be a peaking amplifier 13, and the fourth amplifying element may be a peaking amplifier 14.

With this configuration, the power amplifier circuit 1 can operate as a Doherty amplifier circuit, and with the provision of the three peaking amplifiers 12 through 14 for one carrier amplifier 11, a large amount of back-off can be secured. For the provision of the four amplifiers, that is, the carrier amplifier 11 and the peaking amplifiers 12 through 14, four transformers are not provided, but the two transformers 26 and 27 and the two ¼-wavelength transmission lines 22 and 24 are disposed. It is thus possible to implement a small-sized power amplifier circuit 1 having a large amount of back-off.

Since the power amplifier circuit 1 has a large amount of back-off while maintaining high efficiency, it can regulate a decrease in efficiency even with the input of a radio-frequency signal using a digital modulation method having a high PAPR.

Moreover, for example, in the power amplifier circuit 1, assuming the power level of a radio-frequency signal input into the power amplifier circuit 1 is a first power value, the carrier amplifier 11 and the peaking amplifiers 12 through 14 may be turned ON. Assuming the power level of the radio-frequency signal input into the power amplifier circuit 1 is a second power value, which is smaller than the first power value, the carrier amplifier 11 and the peaking amplifiers 12 and 13 may be turned ON and the peaking amplifier 14 may be turned OFF. Assuming the power level of the radio-frequency signal input into the power amplifier circuit 1 is a third power value, which is smaller than the second power value, the carrier amplifier 11 and the peaking amplifier 12 may be turned ON and the peaking amplifiers 13 and 14 may be turned OFF. Assuming the power level of the radio-frequency signal input into the power amplifier circuit 1 is a fourth power value, which is smaller than the third power value, the carrier amplifier 11 may be turned ON and the peaking amplifiers 12 through 14 may be turned OFF.

With this configuration, assuming the level of an input signal shifts from a high level to a low level, the peaking amplifiers 14, 13, and 12 are sequentially turned OFF in this order, and the impedances of the carrier amplifier 11 and a peaking amplifier/peaking amplifiers, which are in the ON state, become higher. This enables the power amplifier circuit 1 to operate with high efficiency in a low output region. Additionally, the peaking amplifiers 12 through 14 are changed to the OFF state in stages. This can secure a large amount of back-off, which is a difference between a certain combination of output power assuming the peaking amplifiers 12 through 14 are ON (state A), output power assuming the peaking amplifiers 12 and 13 are ON (state B), output power assuming the peaking amplifier 12 is ON (state C), and output power assuming the peaking amplifiers 12 through 14 are OFF (state D).

Moreover, for example, in the power amplifier circuit 1, a bias current supplied to the peaking amplifier 13 may be higher than that supplied to the peaking amplifier 14, and a bias current supplied to the peaking amplifier 12 may be higher than that supplied to the peaking amplifier 13.

With this configuration, assuming the level of an input signal shifts from a low level to a high level, the peaking amplifiers 12, 13, and 14 can be turned ON in stages in this order.

Additionally, for example, in the power amplifier circuit 1, the size of each of the peaking amplifiers 12 through 14 may be larger than that of the carrier amplifier 11.

This can elevate saturated power of the peaking amplifiers 12 through 14, thereby further increasing the amount of back-off of the power amplifier circuit 1.

Additionally, for example, in the power amplifier circuit 1, the size of the peaking amplifier 14 may be larger than that of the peaking amplifier 13.

This can make saturated power of the peaking amplifier 14 higher than that of the peaking amplifier 13. This can improve the efficiency, especially in a higher output region (output region from state A to state B) among output regions from state A to state D, for example.

For example, the power amplifier circuit 1 may further include a substrate 90. The carrier amplifier 11 and the peaking amplifiers 12 through 14 may be disposed on or inside of the substrate 90. In a plan view of the substrate 90: a group of the carrier amplifier 11 and the peaking amplifier 12 and a group of the peaking amplifiers 13 and 14 may be arranged in a first direction; the transformer 26 and the ¼-wavelength transmission line 22 may be disposed on or inside of the substrate 90 in a second direction, which is perpendicular to the first direction, on the side of the carrier amplifier 11 and the peaking amplifier 12. The transformer 27 and the ¼-wavelength transmission line 24 may be disposed on or inside of the substrate 90 in the second direction on the side of the peaking amplifiers 13 and 14.

With this configuration, the distance between a group of the carrier amplifier 11 and the peaking amplifier 12 and a group of the transformer 26 and the ¼-wavelength transmission line 22 can be made smaller, and the distance between a group of the peaking amplifiers 13 and 14 and a group of the transformer 27 and the ¼-wavelength transmission line 24 can be made smaller. It is thus possible to enhance the miniaturization of the power amplifier circuit 1 (and the radio-frequency module 6) while reducing transmission loss of the power amplifier circuit 1 (and the radio-frequency module 6).

A power amplifier circuit 1A according to the first modified example of the embodiment includes a carrier amplifier 11, peaking amplifiers 13 and 14, a transformer 26 including an input coil 261 and an output coil 262, a transformer 27 including an input coil 271 and an output coil 272, an output terminal 110 to which one end of the output coil 262 is connected, and a ¼-wavelength transmission line 24. The output terminal of the carrier amplifier 11 is connected to one end of the input coil 261. The output terminal of the peaking amplifier 13 is connected to one end of the input coil 271. The output terminal of the peaking amplifier 14 is connected to one end of the ¼-wavelength transmission line 24. The other end of the ¼-wavelength transmission line 24 is connected to the other end of the input coil 271. The other end of the input coil 261 is connected to a ground. One end of the output coil 272 is connected to the other end of the output coil 262, and the other end of the output coil 272 is connected to a ground.

With this configuration, the power amplifier circuit 1A can operate as a Doherty amplifier circuit, and with the provision of the two peaking amplifiers 13 and 14 for one carrier amplifier 11, a large amount of back-off can be secured. For the provision of the three amplifiers, that is, the carrier amplifier 11 and the peaking amplifiers 13 and 14, three transformers are not provided, but the two transformers 26 and 27 and one ¼-wavelength transmission line 24 are disposed. It is thus possible to implement a small-sized power amplifier circuit 1A having a large amount of back-off.

A power amplifier circuit 1B according to the second modified example of the embodiment includes a carrier amplifier 11, peaking amplifiers 12 and 13, a transformer 26 including an input coil 261 and an output coil 262, a transformer 27 including an input coil 271 and an output coil 272, an output terminal 110 to which one end of the output coil 262 is connected, and a ¼-wavelength transmission line 22. The output terminal of the carrier amplifier 11 is connected to one end of the input coil 261. The output terminal of the peaking amplifier 12 is connected to one end of the ¼-wavelength transmission line 22. The output terminal of the peaking amplifier 13 is connected to one end of the input coil 271. The other end of the ¼-wavelength transmission line 22 is connected to the other end of the input coil 261. The other end of the input coil 271 is connected to a ground. One end of the output coil 272 is connected to the other end of the output coil 262, and the other end of the output coil 272 is connected to a ground.

With this configuration, the power amplifier circuit 1B can operate as a Doherty amplifier circuit, and with the provision of the two peaking amplifiers 12 and 13 for one carrier amplifier 11, a large amount of back-off can be secured. For the provision of the three amplifiers, that is, the carrier amplifier 11 and the peaking amplifiers 12 and 13, three transformers are not provided, but the two transformers 26 and 27 and one ¼-wavelength transmission line 22 are disposed. It is thus possible to implement a small-sized power amplifier circuit 1B having a large amount of back-off.

A communication device 7 according to the embodiment includes an RFIC 3 that processes a radio-frequency signal and the power amplifier circuit 1 that transfers the radio-frequency signal between the RFIC 3 and an antenna 2.

With this configuration, the communication device 7 can implement the power amplifier circuit 1.

Additionally, for example, the communication device 7 may further include a power supply circuit 5 that supplies a power supply voltage $V_{ET}$ to the power amplifier circuit 1. The power supply circuit 5 may include a power supply control circuit 50 that performs control so that the power supply voltage $V_{ET}$ is variable to multiple discrete voltage levels in accordance with an envelope of the radio-frequency signal.

With this configuration, the power supply voltage $V_{ET}$ based on digital ET can be supplied to the power amplifier circuit 1.

OTHER EMBODIMENTS

The power amplifier circuit and the communication device according to the present disclosure have been discussed above through illustration of the embodiment. However, the power amplifier circuit and the communication device according to the disclosure are not restricted to the above-described embodiment. Other embodiments implemented by combining certain elements in the above-described embodiment and modified examples obtained by making various modifications to the above-described embodiment by those skilled in the art without departing from the scope and spirit of the disclosure are also encompassed in the disclosure. Various types of equipment integrating the above-described radio-frequency circuit and communication device are also encompassed in the disclosure.

In one example, in the circuit configurations of the power amplifier circuit and the communication device according to the above-described embodiment, another circuit element and another wiring may be inserted onto a path connecting circuit elements and/or onto a path connecting signal paths illustrated in the drawings.

INDUSTRIAL APPLICABILITY

The present disclosure can be widely used in communication equipment, such as mobile phones, as a power amplifier circuit or a communication device disposed in a multiband-support front-end section.

REFERENCE SIGNS LIST 1, 1A, 1B power amplifier circuit
2 antenna
3 RFIC
4 BBIC
5 power supply circuit
6 radio-frequency module
7 communication device
10 PA control circuit
11 carrier amplifier
12, 13, 14 peaking amplifier
15 preamplifier
22, 24 ¼-wavelength transmission line
26, 27 transformer
30 low-noise amplifier
41, 42 matching circuit
50 power supply control circuit
51 analog ET tracker
52 digital ET tracker
53, 71, 72, 73 switch
54 power supply
60 diplexer
60H high pass filter
60L low pass filter
61, 62 duplexer
61R, 62R receive filter
61T, 62T transmit filter
70 phase shifter circuit
71a, 71b, 71c, 72a, 72b, 72c, 73a, 73b, 73c terminal
80 semiconductor IC
90 substrate
100 antenna connection terminal
110 output terminal
120 input terminal
130 control terminal
261, 271 input coil
262, 272 output coil

The invention claimed is:

1. A power amplifier circuit comprising:
first, second, third, and fourth amplifying elements;
a first transformer including a first input coil and a first output coil;
a second transformer including a second input coil and a second output coil;
a signal output terminal to which one end of the first output coil is connected; and
first and second phase shifter circuits, wherein
an output terminal of the first amplifying element is connected to one end of the first input coil,
an output terminal of the second amplifying element is connected to one end of the first phase shifter circuit,
an output terminal of the third amplifying element is connected to one end of the second input coil,
an output terminal of the fourth amplifying element is connected to one end of the second phase shifter circuit,
the other end of the first phase shifter circuit is connected to the other end of the first input coil,
the other end of the second phase shifter circuit is connected to the other end of the second input coil, and
one end of the second output coil is connected to the other end of the first output coil, and the other end of the second output coil is connected to a ground.

2. The power amplifier circuit according to claim 1, wherein:
the first amplifying element is a carrier amplifier; and
each of the second, third, and fourth amplifying elements is a peaking amplifier.

3. The power amplifier circuit according to claim 2, wherein:
based on a power level of a radio-frequency signal input into the power amplifier circuit being a first power value, the first, second, third, and fourth amplifying elements are turned ON;
based on the power level of the radio-frequency signal input into the power amplifier circuit being a second power value, the second power value being smaller than the first power value, the first, second, and third amplifying elements are turned ON and the fourth amplifying element is turned OFF;
based on the power level of the radio-frequency signal input into the power amplifier circuit being a third power value, the third power value being smaller than the second power value, the first and second amplifying elements are turned ON and the third and fourth amplifying elements are turned OFF; and
assuming the power level of the radio-frequency signal input into the power amplifier circuit is a fourth power value, the fourth power value being smaller than the third power value, the first amplifying element is turned ON and the second, third, and fourth amplifying elements are turned OFF.

4. The power amplifier circuit according to claim 2, wherein a size of each of the second, third, and fourth amplifying elements is larger than a size of the first amplifying element.

5. The power amplifier circuit according to claim 2, further comprising:
a substrate, wherein
the first, second, third, and fourth amplifying elements are disposed on or inside of the substrate, and
in a plan view of the substrate,
a group of the first and second amplifying elements and a group of the third and fourth amplifying elements are arranged in a first direction,
the first transformer and the first phase shifter circuit are disposed on or inside of the substrate in a second direction on a side of the first and second amplifying elements, the second direction being perpendicular to the first direction, and the second transformer and the second phase shifter circuit are disposed on or inside of the substrate in the second direction on a side of the third and fourth amplifying elements.

6. The power amplifier circuit according to claim 3, wherein:

a bias current supplied to the third amplifying element is higher than a bias current supplied to the fourth amplifying element; and a bias current supplied to the second amplifying element is higher than a bias current supplied to the third amplifying element.

7. The power amplifier circuit according to claim 3, wherein a size of each of the second, third, and fourth amplifying elements is larger than a size of the first amplifying element.

8. The power amplifier circuit according to claim 3, further comprising:

a substrate, wherein the first, second, third, and fourth amplifying elements are disposed on or inside of the substrate, and in a plan view of the substrate, a group of the first and second amplifying elements and a group of the third and fourth amplifying elements are arranged in a first direction, the first transformer and the first phase shifter circuit are disposed on or inside of the substrate in a second direction on a side of the first and second amplifying elements, the second direction being perpendicular to the first direction, and the second transformer and the second phase shifter circuit are disposed on or inside of the substrate in the second direction on a side of the third and fourth amplifying elements.

9. The power amplifier circuit according to claim 6, wherein a size of each of the second, third, and fourth amplifying elements is larger than a size of the first amplifying element.

10. The power amplifier circuit according to claim 6, further comprising:

a substrate, wherein the first, second, third, and fourth amplifying elements are disposed on or inside of the substrate, and in a plan view of the substrate, a group of the first and second amplifying elements and a group of the third and fourth amplifying elements are arranged in a first direction, the first transformer and the first phase shifter circuit are disposed on or inside of the substrate in a second direction on a side of the first and second amplifying elements, the second direction being perpendicular to the first direction, and the second transformer and the second phase shifter circuit are disposed on or inside of the substrate in the second direction on a side of the third and fourth amplifying elements.

11. The power amplifier circuit according to claim 9, wherein the size of the fourth amplifying element is larger than the size of the third amplifying element.

12. The power amplifier circuit according to claim 11, further comprising:

a substrate, wherein the first, second, third, and fourth amplifying elements are disposed on or inside of the substrate, and in a plan view of the substrate, a group of the first and second amplifying elements and a group of the third and fourth amplifying elements are arranged in a first direction, the first transformer and the first phase shifter circuit are disposed on or inside of the substrate in a second direction on a side of the first and second amplifying elements, the second direction being perpendicular to the first direction, and the second transformer and the second phase shifter circuit are disposed on or inside of the substrate in the second direction on a side of the third and fourth amplifying elements.

13. The power amplifier circuit according to claim 1, wherein a size of each of the second, third, and fourth amplifying elements is larger than a size of the first amplifying element.

14. The power amplifier circuit according to claim 1, further comprising:

a substrate, wherein the first, second, third, and fourth amplifying elements are disposed on or inside of the substrate, and in a plan view of the substrate, a group of the first and second amplifying elements and a group of the third and fourth amplifying elements are arranged in a first direction, the first transformer and the first phase shifter circuit are disposed on or inside of the substrate in a second direction on a side of the first and second amplifying elements, the second direction being perpendicular to the first direction, and the second transformer and the second phase shifter circuit are disposed on or inside of the substrate in the second direction on a side of the third and fourth amplifying elements.

15. A power amplifier circuit comprising:

first, second, and third amplifying elements;

a first transformer including a first input coil and a first output coil;

a second transformer including a second input coil and a second output coil;

a signal output terminal to which one end of the first output coil is connected; and a phase shifter circuit, wherein an output terminal of the first amplifying element is connected to one end of the first input coil, an output terminal of the second amplifying element is connected to one end of the second input coil, an output terminal of the third amplifying element is connected to one end of the phase shifter circuit, the other end of the phase shifter circuit is connected to the other end of the second input coil, the other end of the first input coil is connected to a ground, and one end of the second output coil is connected to the other end of the first output coil, and the other end of the second output coil is connected to a ground.

16. The power amplifier circuit according to claim 15, wherein:

the first amplifying element is a carrier amplifier; and each of the second and third amplifying elements is a peaking amplifier.

17. A power amplifier circuit comprising:

first, second, and third amplifying elements;

a first transformer including a first input coil and a first output coil;

a second transformer including a second input coil and a second output coil;

a signal output terminal to which one end of the first output coil is connected; and a phase shifter circuit, wherein an output terminal of the first amplifying element is connected to one end of the first input coil, an output terminal of the second amplifying element is connected to one end of the phase shifter circuit, an output terminal of the third amplifying element is connected to one end of the second input coil, the other end of the phase shifter circuit is connected to the other end of the first input coil, the other end of the second input coil is connected to a ground, and one end of the second output coil is connected to the other end of the first output coil, and the other end of the second output coil is connected to a ground.

18. The power amplifier circuit according to claim 17, wherein:

the first amplifying element is a carrier amplifier; and each of the second and third amplifying elements is a peaking amplifier.

19. A communication device comprising:

a signal processing circuit that processes a radio-frequency signal; and the power amplifier circuit according to claim 1 that transfers the radio-frequency signal between the signal processing circuit and an antenna.

20. The communication device according to claim 19, further comprising:

a power supply circuit that supplies a power supply voltage to the power amplifier circuit, wherein the power supply circuit includes a power supply control circuit that performs control so that the power supply voltage is variable to multiple discrete voltage levels in accordance with an envelope of the radio-frequency signal.

* * * * *